US005801404A

United States Patent [19]
Kahen et al.

[11] Patent Number: 5,801,404
[45] Date of Patent: Sep. 1, 1998

[54] HIGH EFFICIENCY, ALUMINUM GALLIUM ARSENIDE LED ARRAYS UTILIZING ZINC-STOP DIFFUSION LAYERS

[75] Inventors: Keith Brian Kahen, Rochester; Gopalan Rajeswaran, Fairport, both of N.Y.

[73] Assignee: Eastman Kodak Company, Rochester, N.Y.

[21] Appl. No.: 655,052

[22] Filed: May 29, 1996

[51] Int. Cl.[6] ........................................... H01L 33/00
[52] U.S. Cl. ........................ 257/101; 257/88; 257/96; 257/102
[58] Field of Search .................... 257/13, 94, 96, 257/98, 101, 88, 102; 372/45, 46

[56] References Cited

U.S. PATENT DOCUMENTS 5,212,705  5/1993  Kahen et al. .................... 372/46

*Primary Examiner*—Minh-Loan Tran
*Attorney, Agent, or Firm*—Raymond L. Owens

[57] ABSTRACT

An AlGaAs-based light emitting diode array is disclosed wherein each individual pixel contains a Zn-stop diffusion layer of p-type conductivity to control the diffusion process.

4 Claims, 6 Drawing Sheets

HIGH EFFICIENCY, ALUMINUM GALLIUM ARSENIDE LED ARRAYS UTILIZING ZINC-STOP DIFFUSION LAYERS

FIELD OF THE INVENTION

The present invention relates to AlGaAs-based LED arrays.

BACKGROUND OF THE INVENTION

The light sources employed in common LED writing systems are typically homojunction light emitting diodes (LEDs) based on Gallium Arsenide Phosphide alloy materials. In FIG. 1A, a top view of a GaAsP/GaAs LED device 10 is shown. Also shown is a cross-section 1—1 of this device indicating the component layers. An n-type GaAsP alloy layer 15 is grown on an $n^+$-GaAs substrate 16 by vapor phase epitaxy. The resulting epitaxial layer 15 ranges in thickness from 25 to 100 µm across the GaAs substrate 16. A thin diffusion barrier layer of silicon nitride (SiN) 13 is deposited on the surface of the epitaxial layer 15 by plasma-enhanced chemical vapor deposition techniques. Alternate methods, such as, thermal chemical vapor deposition, may also be employed to deposit the diffusion barrier layer 13. The SiN layer 13 is patterned by photolithography to open windows for diffusion. A p-type GaAsP layer 14 is formed in the n-GaAsP epitaxial layer 15 through the window openings by closed-tube or open-tube diffusion techniques commonly employing zinc as a diffusion source. The p/n junction so formed is known as a homojunction. Further wafer processing results in ohmic electrode contact 11 at the p-GaAsP surface and ohmic electrode contact 17 at the $n^+$-GaAs surface. An anti-reflection coating 12 is provided above the LED emitting area to maximize the external quantum efficiency of the device structure 10.

FIG. 1B shows an LED array layout 31 containing a plurality of LEDs 10. Such arrays are commonly used as building block components for LED printhead assemblies. The plurality of LEDs 10 are connected by a plurality of ohmic contact electrode traces 11 to individual wire bond pads 21. On providing wire bonds to these pads 21, all the LEDs in the array 31 become individually addressable from external current sources, such as current source 32.

The wavelength of the LED emission is controlled by the concentration of phosphorus in the epitaxial layer 15. In commercially available LED printheads, the popular emission wavelengths are 660 nm, 685 nm, 720 nm and 740 nm. Any other emission wavelengths, matched to the response of specific photoconductors in the range from 660 nm to 840 nm (GaAs LEDs), are possible.

The external quantum efficiency of GaAsP LEDs, as shown in FIG. 1A, is controlled by five main factors:

i) zinc diffusion junction depth ( depth of the p-GaAsP layer 14);

ii) doping concentration of the n-GaAsP layer 15;

iii) refractive index and thickness of the anti-reflection coating 12;

iv) shadowing caused by the ohmic electrode contact 11;

v) residual concentration of non-radiative recombination centers in layers 14 and 15;

In practice, due to internal self-absorption and optical considerations, only about 1% of the photons generated at the junction make it out of the device. This translates, for example, to external LED radiant intensities of between 1 to 2 uW/sr/mA for $GaAs_{0.67}P_{0.33}$ (685 nm peak wavelength) devices. As the phosphorus concentration is reduced, the quantum efficiencies can be increased by a factor of two.

An attractive means of providing an order-of-magnitude improvement in LED quantum efficiencies is by fabricating more efficient LED structures on Aluminum Gallium Arsenide (AlGaAs) epitaxial material and by the use of heterojunction device structures. However, light emitting diode arrays (for example, 300 dots per inch or higher addressability) based on AlGaAs material are difficult to manufacture. The main challenge is providing effective isolation between adjacent LEDs, i.e., preventing an active LED from turning on a normally inactive neighboring LED. The purpose of this invention is to introduce a novel technique for preventing current crosstalk between adjacent AlGaAs-based LEDs. The technique results in AlGaAs LEDs that are easily manufacturable.

FIG. 2 shows some prior-art AlGaAs LED structures. FIGS. 2A, 2B and 2C indicate three device designs, homojunction type, single-heterojunction type, and the double-heterojunction type, respectively. In each of these structures, the n- and p-type polarities may be inverted as the design dictates.

FIG. 2A shows a homojunction AlGaAs LED structure 100 that employs diffusion techniques to create a p/n junction. An n-$Al_xGa_{1-x}As$ epitaxial layer 110 is grown by either liquid phase epitaxy (LPE) or metal-organic chemical vapor deposition (MOCVD) on an $n^+$-GaAs substrate 111. A thin diffusion barrier layer of SiN 101 is deposited by plasma-enhanced chemical vapor deposition or other suitable techniques. This SiN layer 101 is patterned by photolithography to provide diffusion windows. A p-type $Al_xGa_{1-x}As$ region 104 is formed by diffusing zinc through the window openings either by closed- or open-tube diffusion techniques. Suitable ohmic electrode contacts 102 and 112 are provided at the p-$Al_xGa_{1-x}As$ and $n^+$-GaAs surfaces, respectively. The external quantum efficiency of the LED is improved by forming an anti-reflection layer 103, typically made of SiN material and tuned to quarter-wavelength thicknesses.

FIG. 2B shows a single-heterojunction AlGaAs LED structure 120 that employs mesa-etching techniques to isolate the p/n junction of the device. The use of the mesa-etch ensures that adjacent LEDs are isolated. A p-$Al_xGa_{1-x}As$ epitaxial layer 126 and an n-$Al_yGa_{1-y}As$ epitaxial layer 125 are grown on a $p^+$-GaAs substrate 127 by LPE or MOCVD techniques. The composition of aluminum in epitaxial layer 125 is higher than that of epitaxial layer 126. This design ensures that layer 125 is transparent to photons generated in layer 126 below it. Also the different compositions of aluminum in these two layers, 125 and 126, ensure that the electrical p/n junction formed here is a heterojunction type. By means of photolithography, a suitable etch-mask layer (not shown) is employed to define the areas to be mesa-etched. The etch is terminated after the mesa-etch depth is greater than the thickness of the n-$Al_yGa_{1-y}As$ layer 125. The etch mask is then removed and suitable ohmic electrode contacts 121 and 128 are provided to the surfaces of the n-$Al_yGa_{1-y}As$ and the $p^+$-GaAs substrate layers, respectively. Again, the external LED quantum efficiency is improved by forming an anti-reflection coating 122 over the LED structure. The anti-reflection coating 122 can be made of SiN material and is tuned to quarter-wavelength thicknesses.

FIG. 2C shows a double-heterojunction LED structure 130 that also uses the mesa-etch technique to provide isolation between adjacent LEDs. Epitaxial layers of AlGaAs, namely, layers 135, 134 and 133 are grown sequentially on a $p^+$-GaAs substrate 136. Layers 135 and 133 are p- and n-type $Al_yGa_{1-y}As$ material, respectively, while layer 134 is p-type $Al_xGa_{1-x}As$ material. This latter layer is known as the active layer while the former surrounding layers are known as the cladding layers. The cladding layers 135 and 133 have larger electronic bandgaps than the active layer 134 (the Al content of layers 135 and 133 is larger than that for layer 134), which results in efficient confinement of the injected electrons and holes in this active layer. Such enhanced confinement of injected carriers in a localized junction region leads to improved quantum efficiencies for double-heterojunction structures. The larger bandgaps also ensure that the cladding layers are transparent to the light generated in the active layer. Further processing, similar to that described in FIG. 2B, leads to a device structure containing suitable ohmic electrode contacts 131 and 137. Once again the optical efficiencies are improved by the anti-reflection layer 132, usually made from SiN material. In this structure also, the p/n junctions are isolated by the mesa-etch process.

The most optically efficient device structures are as in FIG. 2C, namely, the double-heterojunction types. The isolation between adjacent LEDs in an array is provided by means of an etch process, as described in reference to FIG. 2B and FIG. 2C. In order for this type of isolation process to be effective, it is necessary to grow the LEDs by MOCVD and to employ a dry etching technique, such as, reactive ion etching (RIE). Both the MOCVD and RIE processes add cost to implement on a manufacturing scale and result in expensive LED arrays. A lower cost growth alternative is LPE; however, it has the unwanted property that the resulting LEDs are difficult to etch due to the oscillations of its epitaxial surface.

SUMMARY OF THE INVENTION

The object of this invention is to provide a high efficiency, highly manufacturable LED array using zinc diffusion technology which enables operation with a minimum of crosstalk between adjacent LEDs in the array.

This object is achieved by a light emitting diode (LED) having an $n^+$-GaAs semiconductor substrate, comprising:
 a) an n-AlGaAs cladding layer deposited on the semiconductor substrate;
 b) an active layer formed on the n-AlGaAs cladding layer;
 c) a Zn-stop diffusion layer of p-type conductivity deposited on the active layer, having an Al content greater than 90%;
 d) a p-AlGaAs cladding layer deposited on the Zn-stop diffusion layer, having an Al content between 55 and 75%; and
 e) electrodes selectively deposited on the substrate and cladding layers.

Advantages

A device design is given that can provide a ten-fold increase in quantum efficiencies, using the technique of zinc diffusion into AlGaAs-based heterojunction structures. The design overcomes manufacturing difficulties associated with the mesa-etch designs of today by using diffusion-stop layers to control the zinc diffusion process. Since the design incorporates conventional LED manufacturing processes such as zinc diffusion and liquid phase epitaxy, it has, relative to the prior art, improved yields and lower costs. Besides these features, the higher quantum efficiencies enable device operation at lower power consumptions.

DETAILED DESCRIPTION OF THE PREFERRED EMBODIMENTS

Previously, as discussed in U.S. Pat. No. 5,212,705 issued May 18, 1993 to Kahen et al., a Zn-stop diffusion layer was incorporated into discrete AlGaAs-based laser diode structures to control reliably the Zn diffusion depth. This invention extends the usage of the Zn-stop diffusion layer to AlGaAs-based LED arrays. For the case of LED arrays used in printhead assemblies, a Zn-diffused region not only provides a low resistance path from the p-contact to the active layer (as desired for discrete laser diodes) but also eliminates LED crosstalk.

Figure 2A:
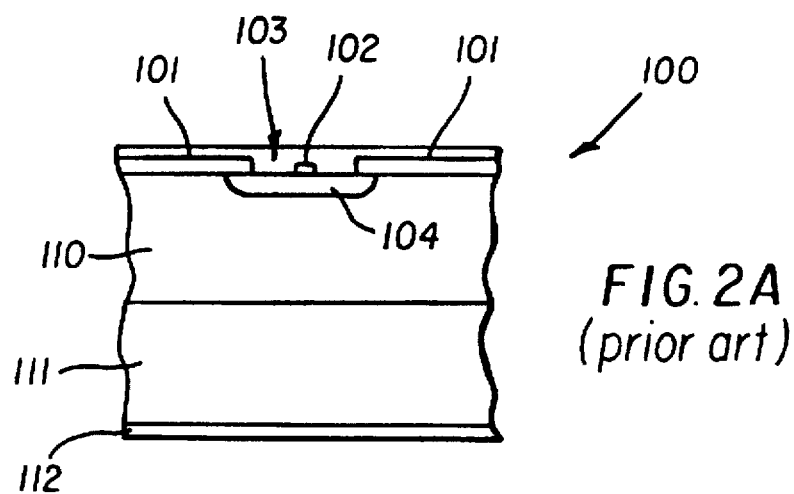
FIGS. 2A–C show the prior art process of making AlGaAs-based LEDs.
Figure 2B:
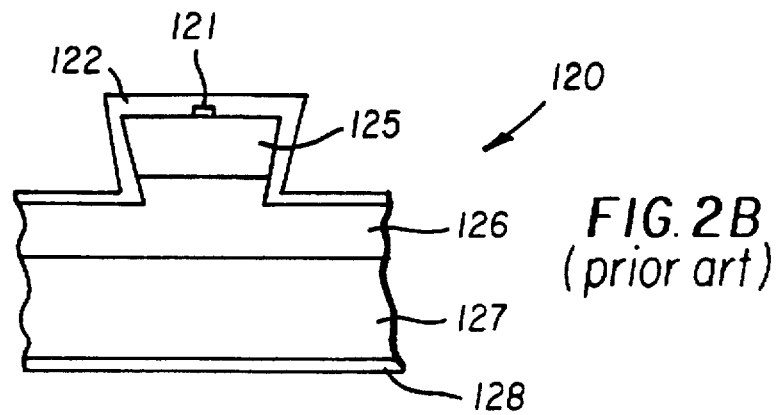
Figure 2C:
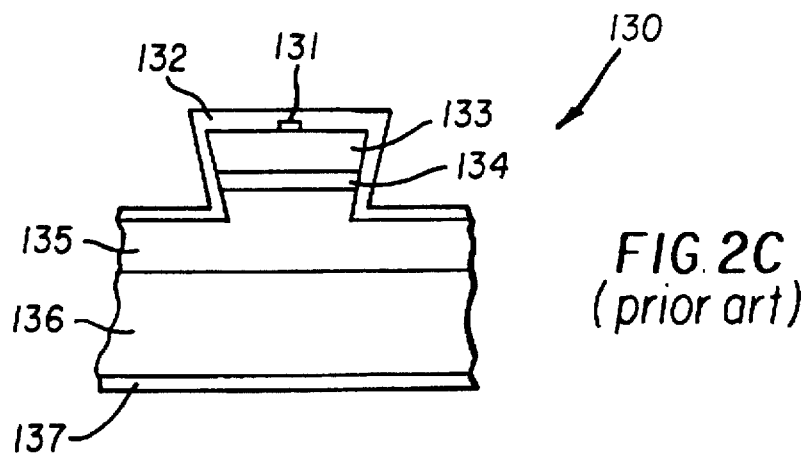
Figure 3:
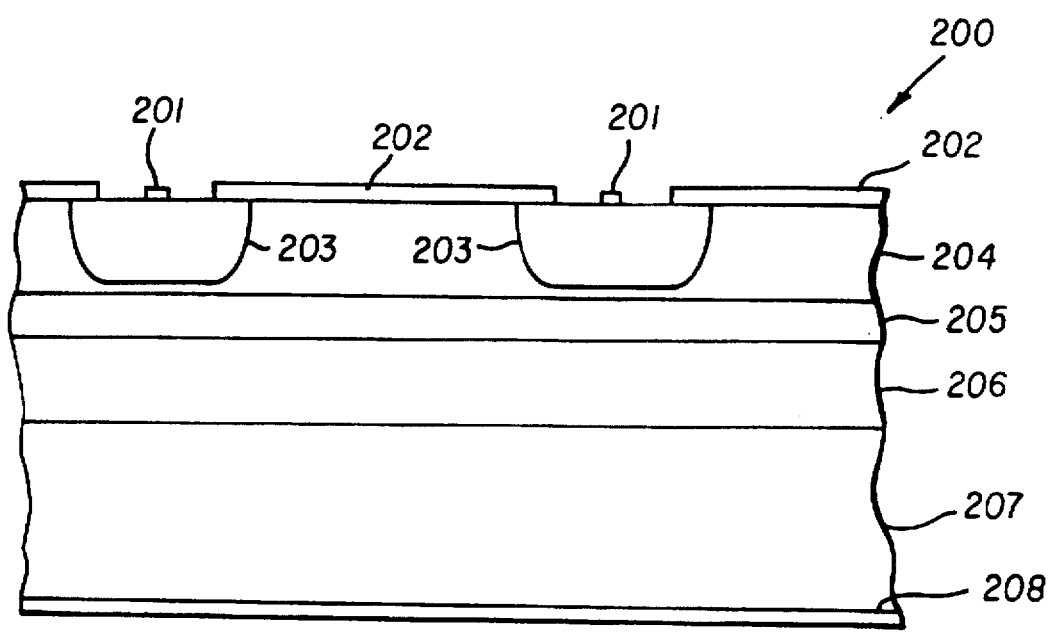
FIG. 3 shows an LED array which uses zinc diffusion.

The present invention uses Zn diffusion instead of etching to define arrays of LEDs that are isolated as a result of the lateral resistance properties of the epitaxial layers. This approach is illustrated in FIG. 3. Upon an $n^+$-GaAs substrate 207, there is grown an n-$Al_yGa_{1-y}$cladding layer 206. On the surface of 206 is formed an n-$Al_xGa_{1-x}As$ active layer 205. Upon 205 is formed a p-$Al_yGa_{1-y}As$ cladding layer 204. As in FIG. 2C the Al content of the cladding layers is higher than that of the active layer. On the surface of 204 is deposited a SiN diffusion barrier layer 202. Photolithography is used to selectively open windows in 202 such that a Zn-diffused region 203 can be formed in the p-$Al_yGa_{1-y}As$ cladding layer by open- or closed-tube Zn diffusion techniques. Also selectively deposited on the p-$Al_yGa_{1-y}As$ cladding layer is a p-ohmic electrode metal 201. An n-ohmic electrode metal 208 is uniformly deposited on layer 207. Unfortunately, the thickness variations in the LPE-grown epitaxial layers, layer 204 specifically, that plague the etching process will also affect the junction-depth distributions in the finished devices. Shallow diffusions result in low light intensities and short lifetimes, while diffusions beyond the heterojunction lead to shorted-out LEDs.

Figure 4:
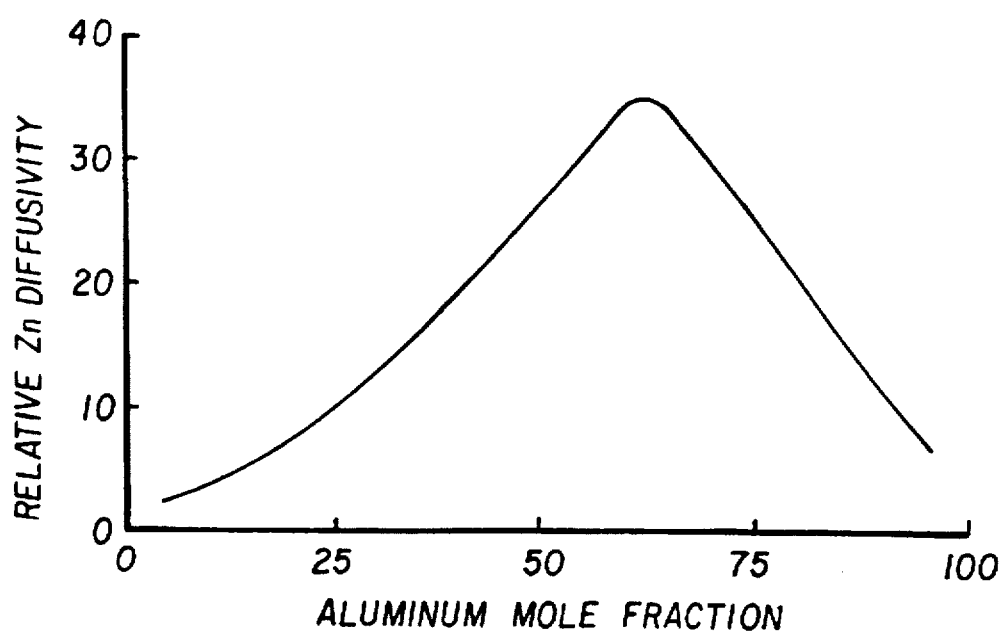
FIG. 4 depicts the Zn diffusion rate with respect to the Al content in AlGaAs.

FIG. 4 shows a plot of the diffusivity of Zn in AlGaAs as a function of the Al content of the AlGaAs. The important characteristic of this figure is that the diffusivity reaches a peak at an Al mole fraction of 62% and at a mole fraction of 100% is smaller by a factor of 9. Even though an analogous decrease in the diffusivity occurs for mole fractions less than 62%, as discussed in U.S. Pat. No. 5,212,705, device structures incorporating low Al-mole fraction Zn-stop layers have poor device performance.

Figure 1A:
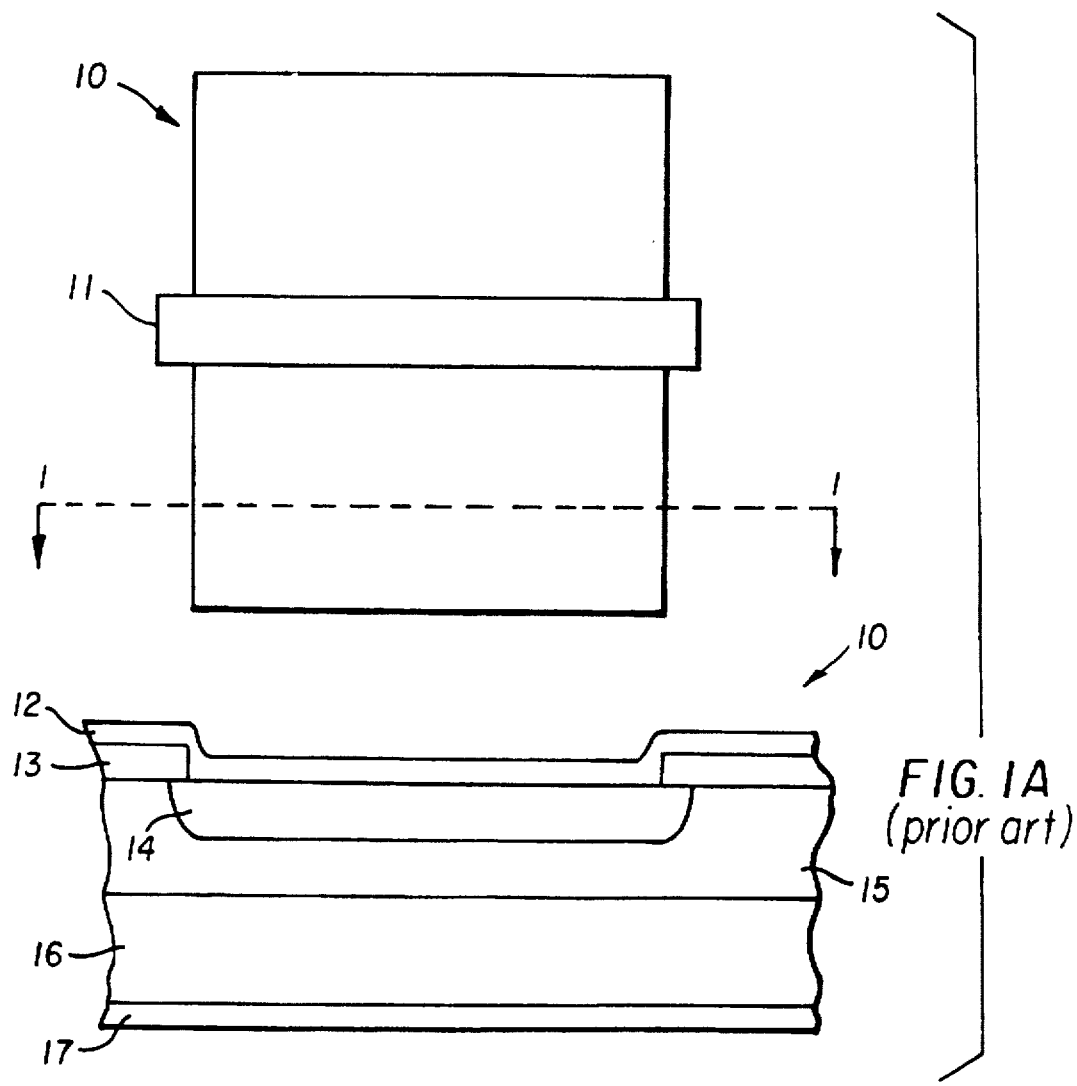
FIG. 1A is a cross sectional view of a conventional light emitting diode.
Figure 1B:
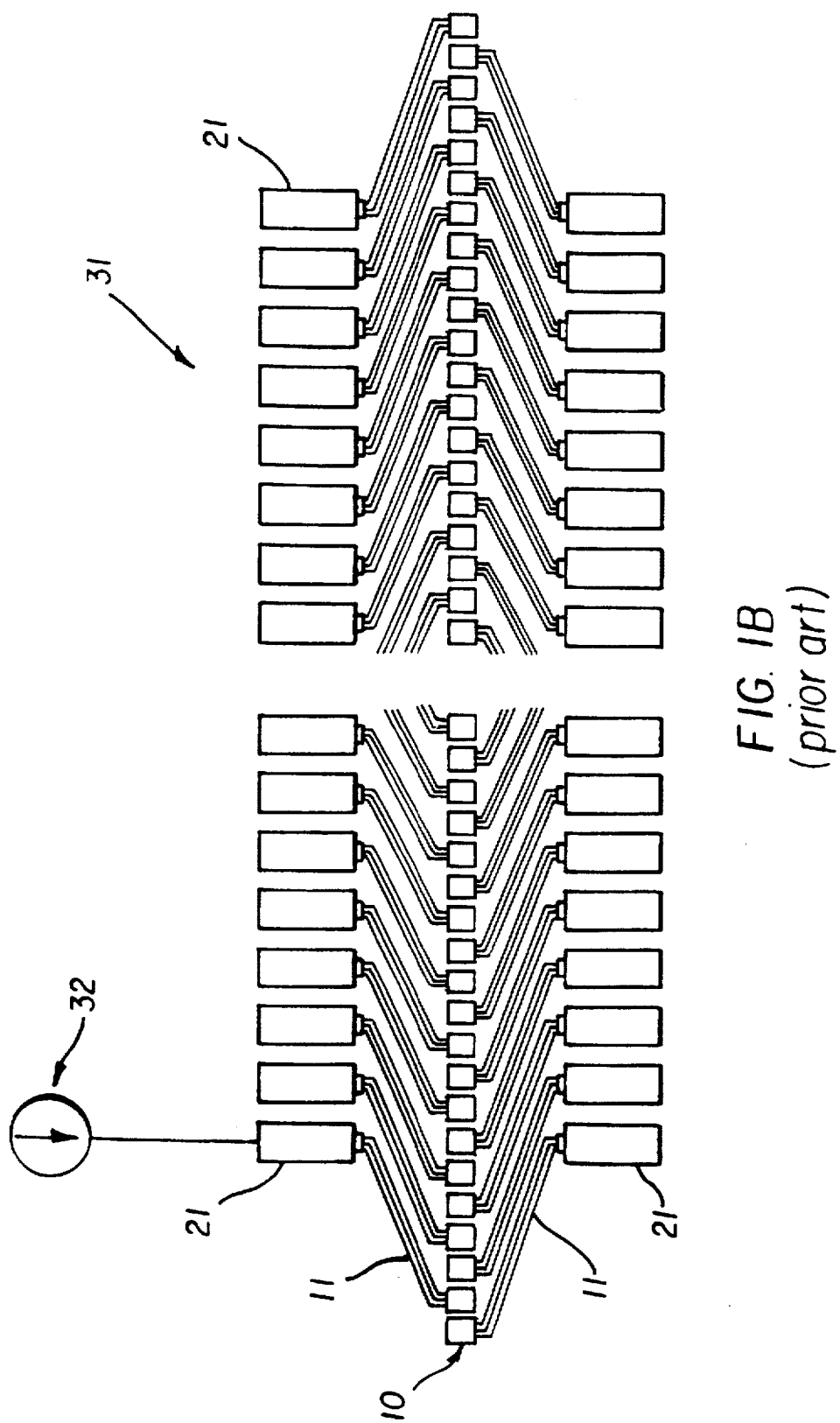
FIG. 1B is a typical layout for a prior art LED array.
Figure 5:
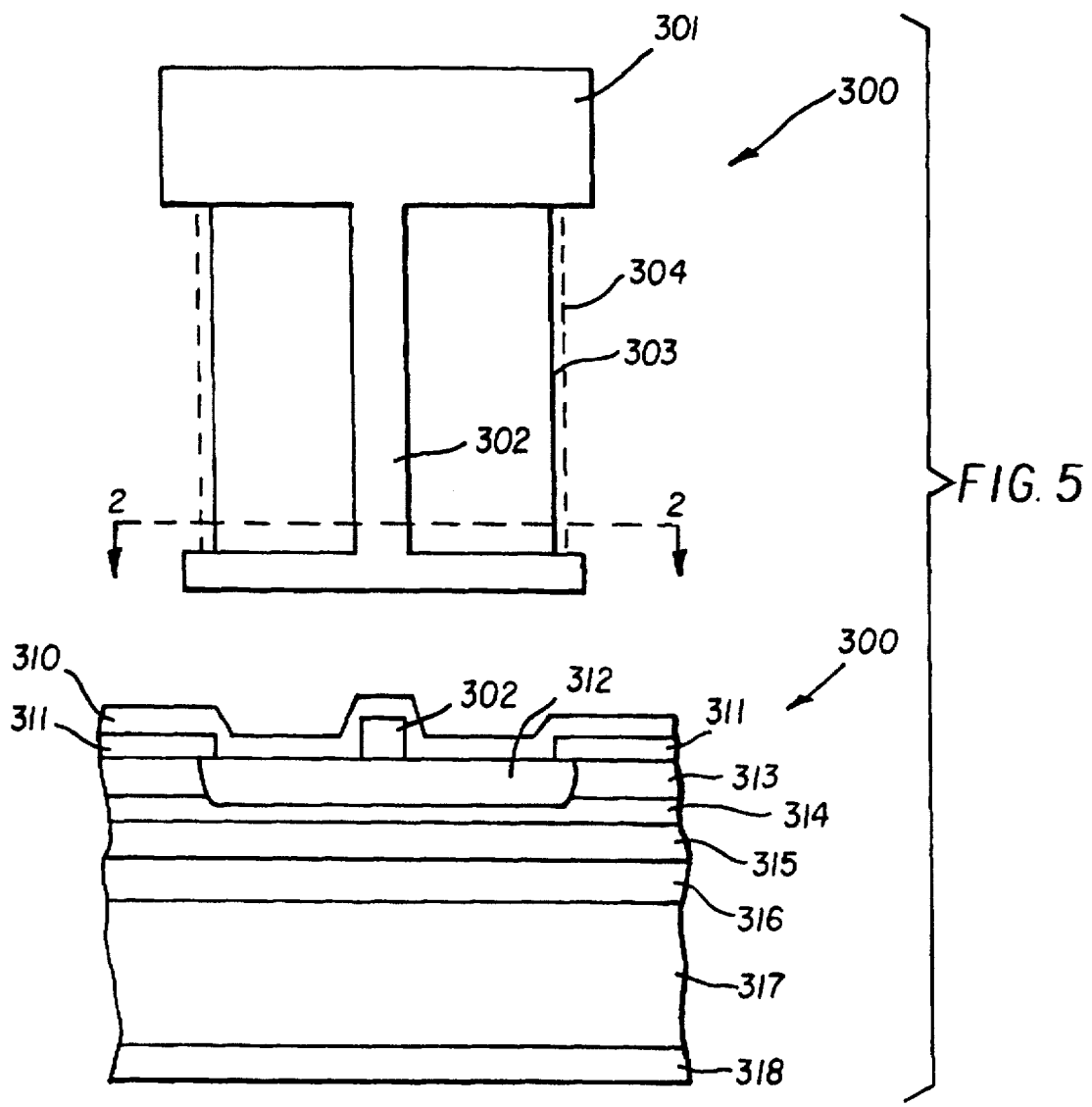
FIG. 5 is a light emitting diode structure according to this invention.

In accordance with this invention, there is provided an LED pixel, 300, as illustrated in FIG. 5. A plurality of such LED pixels are commonly used to make LED arrays for use in an LED printhead assembly. Metallization pattern 301 is provided to the LED pixel 300 (from associated wire bond pads which are shown in FIG. 1B) as shown in the top view of FIG. 5. The typical width of the ohmic electrode contact 302 overlying the diffused region of the LED is 5 μm. The diffusion opening 303 is 25 μm wide in the direction perpendicular to the ohmic electrode contact 302 and 30 μm wide in the direction parallel to the contact. The area of region 303 can be decreased or enlarged depending on the size of the pixel desired for a particular printhead application. The extent of lateral diffusion under the diffusion opening is indicated by 304. Cross-section 2—2 reveals the component layers of the LED pixel 300. Upon an n⁺-GaAs substrate 317, there is grown an n-AlGaAs cladding layer 316, having a nominal thickness of 1.5 μm and Al content of 50%. The n-AlGaAs cladding layer 316 is doped with materials, such as, Si or Sn, to a concentration from $10^{17}$ to $10^{19}$ atoms/cm³, with a preferred density of $5 \times 10^{17}$ atoms/cm³. The preferred method of deposition is liquid phase epitaxy. On the surface of 316 is formed an AlGaAs active layer 315, having a nominal thickness of 1.0 μm. In the active layer light is produced as a result of the recombination of electrons and holes injected from the n- and p-cladding layers, respectively. The preferred Al content of the active layer is 31%, such that, device 300 has an emission wavelength of 685 nm. Other AlGaAs compositions can be employed to result in other wavelengths of emission. The doping of the active layer lies typically in the range of $10^{17}$ to $10^{18}$ atoms/cm³, with a preferred density of $1 \times 10^{17}$ atoms/cm³; and may be of either dopant type, preferably n-type.

Upon 315 is formed the p-AlGaAs Zn-stop diffusion layer, 314, followed by the p-AlGaAs cladding layer 313. The Al contents of these two layers range from 85 to 100% and 55 to 75%, respectively, with preferred values of 90 and 62%, respectively. Layers 314 and 313 have nominal thicknesses of 0.25 and 0.30 μm, respectively. Both layers are doped p-type with materials, such as, C, Be, or Zn, to a concentration from $10^{16}$ to $10^{18}$ atoms/cm³, with preferred densities of $5 \times 10^{17}$ and $1 \times 10^{16}$ atoms/cm³, respectively. The doping of layer 313 is kept low in order to prevent current crosstalk between adjacent LED array elements. FIG. 4 shows that there is a large difference in the Zn diffusivities through the Zn-stop and p-cladding layers at these preferred Al compositions. Indeed, it can be determined that it requires a factor of two greater time for Zn to diffuse through the Zn-stop layer compared to through the p-cladding layer. This time differential is sufficient to guarantee the stoppage of the diffusion front within the Zn-stop layer. FIG. 4 also indicates that the time differential can be increased, for example to a factor of three, by employing AlAs in layer 314. More specifically, for the case of employing AlAs in layer 314, the factor of three time differential can be obtained by choosing the thicknesses of the Zn-stop diffusion and p-cladding layers to be 0.2 and 0.35 μm, respectively. The preferred embodiment has the Zn-stop diffusion layer composed of $Al_{0.90}Ga_{0.10}As$, instead of AlAs, since pure AlAs is typically difficult to grow using LPE and it is more realistic to assume that the Zn-stop layer can be reliably grown using $Al_{0.90}Ga_{0.10}As$.

On the surface of layer 313 is formed the SiN diffusion barrier layer 311. Its preferred method of growth is plasma-enhanced chemical vapor deposition; however, as practiced in the art, layer 311 can be formed by many other methods. Its thickness is typically 0.3 μm. The Zn-diffused region 312 is formed by selectively opening windows in layer 311 via photolithography and diffusing Zn into the p-AlGaAs surface by standard closed-tube diffusion techniques. As practiced in the art, Zn can be diffused into the surface by many other methods. At best, it is preferred to have the Zn front stop just short of the active layer 315; however, device 300 will operate properly as long as the Zn front penetrates into the Zn-stop diffusion layer.

Following the Zn diffusion, electrically conductive ohmic metals, 318 and 302, are deposited on the GaAs substrate and p-AlGaAs cladding layers, respectively. Ohmic metal 302 is patterned on the surface of 312 by using either standard photolithographic and etching techniques or by lift-off techniques. The ohmic metal on the n-type GaAs surface can be based on Au—Ge, Au—Sn eutectic alloys. The preferred embodiment employs a Ni/AuGe/Ag/Au multilayer metallization. The ohmic metal on the p-type AlGaAs surface can be based on the Au—Zn alloy scheme, where the preferred embodiment employs a Au/AuZn/Au multilayer metallization. Additional metallization patterns or islands can be created in the non-emitting regions between and around the LED pixels to provide some shadowing and clear optical demarcation between pixels. In this way, all light created between pixels due to current spreading will be effectively shadowed. Anti-reflection coating layer 310 is provided on the top of the LED pixel 300 in order to maximize the pixel's external quantum efficiency. Layer 310 is made of SiN and has a thickness tuned to quarter-wavelength thicknesses, i.e., for an emission wavelength of 685 nm, its thickness is 0.09 μm.

Figure 6:
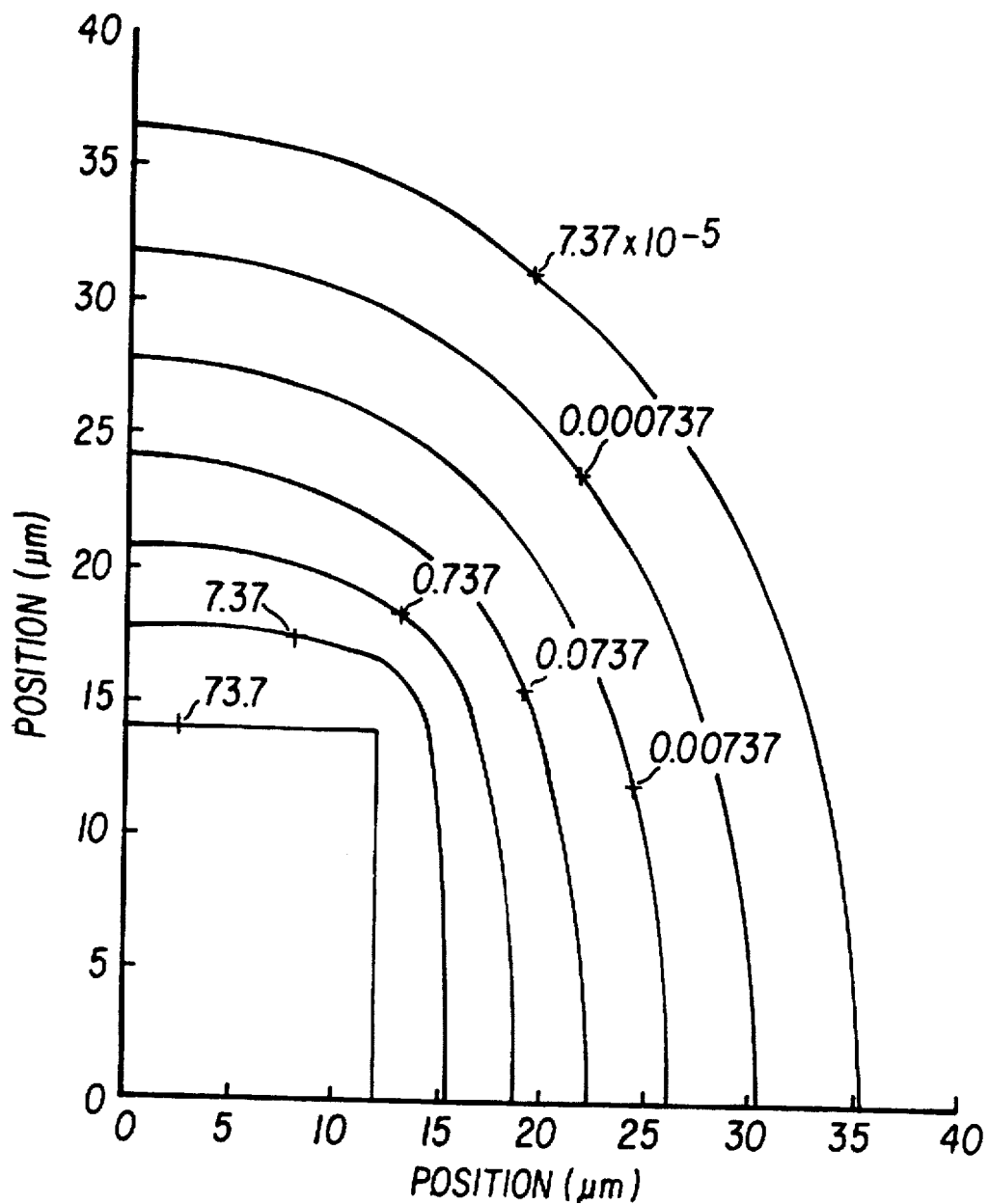
FIG. 6 depicts the fall-off in the current injected into the active layer for the LED indicated in this invention

Given the pixel structure 300 it is straightforward to perform a current spreading calculation to determine the degree of current crosstalk between two neighboring LED pixels. The results of the computation are given in FIG. 6, wherein the figure indicates the amount of current injected into the active layer as a function of distance from an on-LED pixel (25×30 μm). For 600 dpi (dots per inch) resolution, neighboring LEDs are separated by 42.3 μm. The figure shows that the current crosstalk is a factor of $10^4$ smaller than the direct current contribution. Accordingly, creation of a Zn-diffused region extending from the p-contact minimizes current crosstalk and effectively isolates neighboring LED pixels.

Thus, there is provided by the present invention an AlGaAs-based semiconductor light emitting diode array wherein each pixel employs a patterned Zn diffusion to obtain a selective low resistance path from the p-ohmic metal to the active layer. By virtue of the usage of a high Al-content Zn-stop diffusion layer in the structure, it becomes possible to control reproducibly the depth of the Zn front. The ability to control the depth of the Zn diffusion front is highly desirable since it enables the usage of manufacturable growth processes, such as liquid phase epitaxy, while avoiding the necessity of employing expensive etching processes to isolate neighboring pixel elements.

The invention has been described in detail with particular reference to a preferred embodiment thereof, but it will be understood that variations and modifications can be effected within the spirit and scope of the invention.

We claim:

1. A light emitting diode (LED) having an n⁺-GaAs semiconductor substrate, comprising:

a) an n-AlGaAs cladding layer deposited on the semiconductor substrate;

b) an active layer formed on the n-AlGaAs cladding layer;

c) a p-type conductivity layer deposited on the active layer having an Al content greater than 90% and being doped with p-type materials at a concentration range of $2.5 \times 10^{17}$ to $-1 \times 10^{18}$ atoms/cm³ in order to form a Zn-stop diffusion layer;

d) a p-AlGaAs cladding layer deposited on the Zn-stop diffusion layer, having an Al content between 55 and 75% and being doped with p-type materials at a concentration range of $1 \times 10^{16}$ to $2.5 \times 10^{16}$ atoms/cm³; and e) electrodes selectively deposited on the substrate and cladding layers.

2. The invention of claim 1 in which Zn is selectively diffused into the p-AlGaAs cladding and Zn-stop diffusion layers.

3. The invention of claim 2 in which an anti-reflection coating is deposited on the surface of the LED.

4. A light emitting diode array comprising:
   a) a plurality of LEDs being arranged in a row; each LED including:
      (i) an n-AlGaAs cladding layer deposited on an $n^+$-GaAs semiconductor substrate;
      (ii) an active layer formed on the n-AlGaAs cladding layer;
      (iii) a p-type conductivity layer deposited on the active layer having an Al content greater than 90% and being doped with p-type materials at a concentration range of $2.5 \times 10^{17}$ to $-1 \times 10^{18}$ atoms/cm$^3$ in order to form a Zn-stop diffusion layer;
      (iv) a p-AlGaAs cladding layer deposited on the Zn-stop diffusion layer, having an Al content between 55 and 75% and being doped with p-type materials at a concentration range of $1 \times 10^{16}$ to $2.5 \times 10^{16}$ atoms/cm$^3$; and
      (v) electrodes selectively deposited on the substrate and cladding layers; and
   b) an arrangement of bond pads, with each bond pad connected to one of the light emitting elements.

* * * * *